(12) United States Patent
Long et al.

(10) Patent No.: US 6,790,750 B1
(45) Date of Patent: Sep. 14, 2004

(54) SEMICONDUCTOR-ON-INSULATOR BODY-SOURCE CONTACT AND METHOD

(75) Inventors: Wei Long, Sunnyvale, CA (US); Qi Xiang, San Jose, CA (US); Yowjuang W. Liu, San Jose, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 58 days.

(21) Appl. No.: 10/163,676

(22) Filed: Jun. 6, 2002

Related U.S. Application Data

(62) Division of application No. 09/541,126, filed on Mar. 31, 2000, now Pat. No. 6,441,434.

(51) Int. Cl.[7] .................. H01L 21/425; H01L 27/01
(52) U.S. Cl. .................. 438/517; 438/149; 438/479; 438/682; 257/347
(58) Field of Search .................. 438/149, 286, 438/300–303, 479–481, 514, 517, 682, 683; 257/347–354, 382, 384

(56) References Cited

U.S. PATENT DOCUMENTS

| | | |
|---|---|---|
| 5,008,723 A | 4/1991 | Van Der Have |
| 5,185,280 A | 2/1993 | Houston et al. |
| 5,215,931 A | 6/1993 | Houston |
| 5,317,181 A | 5/1994 | Tyson |
| 5,471,421 A | 11/1995 | Rose et al. |
| 5,489,792 A | 2/1996 | Hu et al. |
| 5,578,865 A | 11/1996 | Vu et al. |
| 5,656,844 A | 8/1997 | Klein et al. |
| 5,698,869 A | 12/1997 | Yoshimi et al. |
| 5,777,362 A | 7/1998 | Pearce |
| 5,818,085 A | 10/1998 | Hsu et al. |
| 5,904,512 A | 5/1999 | Chang et al. |
| 5,933,020 A | 8/1999 | Bothra |
| 5,949,104 A * | 9/1999 | D'Anna et al. ............. 257/335 |
| 5,998,840 A | 12/1999 | Kim |
| 6,008,077 A | 12/1999 | Maeda |
| 6,025,242 A | 2/2000 | Ma et al. |
| 6,051,494 A | 4/2000 | Iwamatsu et al. |
| 6,084,280 A | 7/2000 | Gardner et al. |
| 6,160,291 A | 12/2000 | Imai |
| 6,180,502 B1 | 1/2001 | Liang |
| 6,204,170 B1 | 3/2001 | Taguwa |
| 6,268,630 B1 | 7/2001 | Schwank et al. |

FOREIGN PATENT DOCUMENTS

| | | |
|---|---|---|
| EP | 0 497 216 A2 | 8/1992 |
| EP | 0 755 077 A2 | 1/1997 |
| JP | 2-3980 | 1/1990 |
| JP | 2-35741 | 2/1990 |
| JP | 4-14262 | 1/1992 |

OTHER PUBLICATIONS

U.S. patent application Ser. No. 09/541,127, Long et al., filed Mar. 31, 2000.
U.S. patent application Ser. No. 09/541,124, Long et al., filed Mar. 31, 2000.
U.S. patent application Ser. No. 09/484,634, Buynoski et al., Jan. 18, 2000.
Scott Thompson, et al.; MOS Scaling: Transistor Challenges for the 21st Century; Intel Technology Journal, 3rd Quarter (1998).

* cited by examiner

*Primary Examiner*—Ori Nadav
(74) *Attorney, Agent, or Firm*—Renner, Otto, Boisselle & Sklar, LLP

(57) ABSTRACT

A semiconductor device includes a wafer having a semiconductor layer with source, body and drain regions. A electrically-conducting region of the semiconductor region overlaps and electrically couples the source region and the body region. The electrical coupling of the source and body regions reduces floating body effects in the semiconductor device. A method of constructing the semiconductor device utilizes spacers, masking, and/or tilted implantation to form an source-body electrically-conducting region that overlaps the source and body regions of the semiconductor layer, and a drain electrically-conducting region that is within the drain region of the semiconductor layer.

7 Claims, 12 Drawing Sheets

SEMICONDUCTOR-ON-INSULATOR BODY-SOURCE CONTACT AND METHOD

This application is a division of application Ser. No. 09/541,126, filed Mar. 31, 2000 now U.S. Pat. No. 6,441, 434. This application is also related to application Ser. No. 09/541,124, filed Mar. 31, 2000, U.S. Pat. No. 6,373,103, and to application Ser. No. 09/541,127, filed Mar. 31, 2000.

BACKGROUND OF THE INVENTION

1. Technical Field of the Invention

The invention relates generally to semiconductor-on-insulator devices and methods for forming the same. The invention relates particularly to semiconductor-on-insulator devices and methods for forming which avoid or reduce floating body effects.

2. Description of the Related Art

Silicon on insulator (SOI) materials offer potential advantages over bulk materials for the fabrication of high performance integrated circuits. Dielectric isolation and reduction of parasitic capacitance improve circuit performance, and eliminate latch-up in CMOS circuits. Compared to bulk circuits, SOI is more resistant to radiation. For example, silicon-on-sapphire (SOS) technology has been successfully used for years to fabricate radiation-hardened CMOS circuits for military applications. Circuit layout in SOI can be greatly simplified and packing density greatly increased if the devices are made without body contacts (i.e., if the body regions of these devices are "floating"). However, partially-depleted metal oxide semiconductor field effect transistors (MOSFETs) on SOI materials typically exhibit parasitic effects due to the presence of the floating body (floating body effects). The partially-depleted devices are such that the maximum depletion width in the body is smaller than the thickness of the semiconductor Si layer, and a quasi-neutral region results which has a floating potential. These floating body effects may result in undesirable performance in SOI devices.

It will be appreciated from the foregoing that a need exists for SOI MOSFETs having reduced floating body effects.

SUMMARY OF THE INVENTION

A semiconductor device includes a wafer having a semiconductor layer with source, body and drain regions. An electrically-conducting region of the semiconductor region overlaps and electrically couples the source region and the body region. The electrical coupling of the source and body regions reduces floating body effects in the semiconductor device. A method of constructing the semiconductor device utlizes spacers, masking, and/or tilted implantation to form an source-body electrically-conducting region that overlaps the source and body regions of the semiconductor layer, and a drain electrically-conducting region that is within the drain region of the semiconductor layer.

According to an aspect of the invention, a semiconductor device includes a semiconductor layer with source and body regions of different conductivity, the semiconductor layer having an electrically-conducting region which overlaps the source and body regions.

According to another aspect of the invention, a semiconductor device includes a gate mounted on a layer of semiconductor material, the semiconductor material having a source region and a drain region which are symmetric with one another about the gate, and having a pair of electrically-conducting regions on opposite sides of the gate, the electrically-conducting regions being asymmetric with one another about the gate.

According to yet another aspect of the invention, a semiconductor device includes a gate mounted on a layer of semiconductor material, the semiconductor material having a source region and a drain region which are asymmetric with one another about the gate, and having a pair of electrically-conducting regions on opposite sides of the gate, the electrically-conducting regions being symmetric with one another about the gate.

According to still another aspect of the invention, a semiconductor device includes a gate mounted on a silicon-on-insulator wafer, the wafer including suicide regions on opposite sides of the gate which are asymmetric with one another about the gate.

According to a further aspect of the invention, a semiconductor device includes a gate mounted on a layer of semiconductor material, the semiconductor material having a source region and a drain region which are asymmetric with one another about the gate.

According to a still further aspect of the invention, a method of forming a semiconductor device includes using angled implanting to form a portion of a source region and a portion of a drain region which are asymmetric with one another about a gate.

According to another aspect of the invention, a method of forming a semiconductor device includes using partial masking of a surface of the device in forming a source region and a drain region which are asymmetric with one another about a gate.

According to yet another aspect of the invention, a method of forming a semiconductor device includes using spacers on opposite sides of a gate which are asymmetric with one another about the gate, to form semiconductor-metal compound regions on opposite sides of the gate which are asymmetric with one another.

According to still another aspect of the invention, a semiconductor device includes a semiconductor layer having source, drain, and body regions which are operatively coupled together, and an electrically-conducting region within the source and body regions, the electrically-conducting region electrically coupling the source region and the body region.

According to a further aspect of the invention, a method of forming a semiconductor device includes the steps of forming source, drain, and body regions in a semiconductor layer, and forming an electrically-conducting region including part of the source region and part of the body region, the electrically-conducting region electrically coupling the source region and the body region.

According to a still further aspect of the invention, a semiconductor device includes a semiconductor layer having a pair of adjacent regions of opposite conductivity, and an electrically-conducting region overlapping and electrically coupling the adjacent regions.

According to another aspect of the invention, a semiconductor device includes a semiconductor layer having source, drain, and body regions; a gate on the semiconductor layer, the gate operatively coupled to the source, drain, and body regions; and a pair of electrically-conducting regions on respective opposite sides of the gate, the electrically-conducting regions being substantially symmetric with one another about the gate; wherein one of the electrically-conducting regions electrically couples the source region and the body region.

According to yet another aspect of the invention, a method of forming a semiconductor device includes the steps of forming source, drain, and body regions in a semiconductor layer; forming a gate on the semiconductor layer before, during, or after the forming source, drain, and body regions; and forming a source-body electrically-conducting region including part of the source region and part of the body region, the electrically-conducting region electrically coupling the source region and the body region, and a drain electrically-conducting region; wherein the electrically-conducting regions are substantially symmetric about the gate.

According to still another aspect of the invention, a semiconductor device includes a semiconductor layer having source, drain, and body regions; a gate operatively coupled to the source, drain, and body regions; and an electrically-conducting region within the source and body regions, the electrically-conducting region electrically coupling the source region and the body region; wherein the source region is substantially symmetric to the drain region about the gate.

According to a further aspect of the invention, a method of forming a semiconductor device includes the steps of forming source, drain, and body regions in a semiconductor layer; forming a gate on the semiconductor layer before, during, or after the forming source, drain, and body regions; and forming an electrically-conducting region including part of the source region and part of the body region, the electrically-conducting region electrically coupling the source region and the body region; wherein the source and drain regions are substantially symmetric about the gate.

According to a still further aspect of the invention, a semiconductor device comprising a semiconductor layer and a gate on the semiconductor layer, wherein the semiconductor layer includes a pair of electrically-conducting regions on opposite sides of the gate, the electrically-conducting regions being asymmetric with one another about the gate.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION

Figure 1:
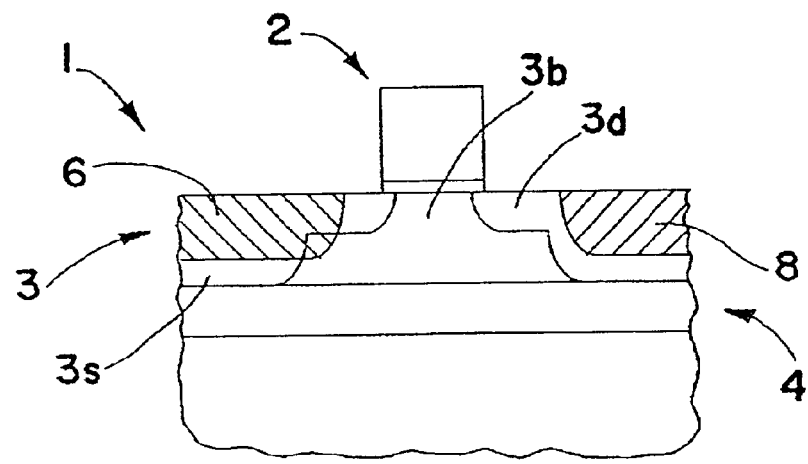
FIG. 1 is a conceptual sketch of a semiconductor device in accordance with the present invention.

Referring initially to FIG. 1, a conceptual sketch is shown of a semiconductor device 1 which reduces floating body effects. The semiconductor device 1 includes a gate 2 mounted on a layer 3 of semiconductor material which is part of a wafer 4. The layer 3 includes source, body, and drain regions 3s, 3b, and 3d, respectively, the source and drain regions having a conductivity opposite that of the body region. The regions 3s, 3b, and 3d, are designed to be operatively coupled with the gate 2 to function as a conventional semiconductor transistor device, for example a metal oxide semiconductor field effect transistor (MOSFET). A source-body electrically-conducting region 6 provides a means for electrically connecting the source region 3s to an external voltage source. Similarly, a drain electrically-conducting region 8 provides means for electrically connecting the drain region 3d to ground or another external voltage. The term "electrically-conducting region," as used herein, denotes a region having enhanced electrical conductivity compared to surrounding regions, in particular an enhanced electrical conductivity such as to enable electrical conduction across boundaries between semiconductor regions of opposite conductivity.

The source-body electrically-conducting region 6 includes parts of both the source region 3s and the body region 3b, thereby electrically coupling the source and body regions. This electrical coupling of the source and body regions 3s and 3b thereby substantially eliminates the floating body effect which might otherwise occur if the body region was electrically isolated.

The broad concept having been explained, what follows are details of several embodiments. The details of certain common similar features between various of the embodiments are omitted in the following description for the sake of brevity. It will be appreciated that features of the various embodiments may be combined with one another and may be combined with features of the broad concept described above.

Figure 2:
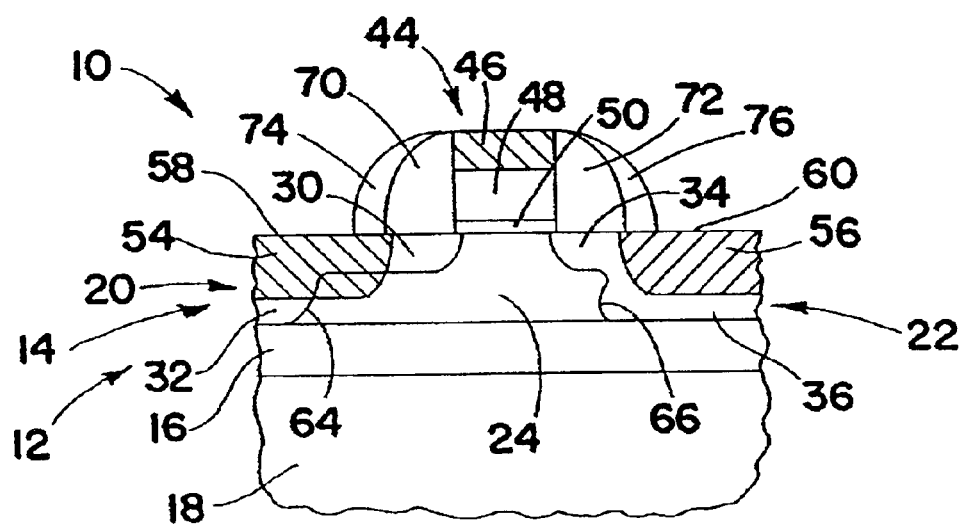
FIG. 2 is a side sectional view of a first embodiment semiconductor device in accordance with the present invention.

Referring now to FIG. 2, a semiconductor device 10 is shown which has a novel SOI body-source electrical contact made using asymmetry in formation of the source and drain regions due to angled implantation in the formation of the regions. The semiconductor device 10 includes a wafer 12, the wafer including a semiconductor layer 14, a buried insulator layer 16, and a bulk semiconductor region 18. An exemplary wafer 12 is a silicon-on-insulator (SOI) wafer with silicon in the semiconductor layer 14 and the bulk semiconductor region 18, and silicon dioxide ($SiO_2$) in the buried insulator layer 16.

The semiconductor layer 14 is divided into a source region 20, a drain region 22, and a body region 24 which is between the source region and the drain region. The source region 20 and the drain region 22 have opposite conductivity from the body region 24. For example the source and drain regions may have N-type conductivity, with the body region having P-type conductivity. Alternatively the source and drain regions may have P-type conductivity, with the body region having N-type conductivity.

The source region 20 includes a shallow-doped source subregion 30 and a deep-doped source subregion 32. Similarly, the drain region 22 includes a shallow-doped subregion 34 and a deep-doped drain subregion 36. The shallow-doped subregions 30 and 34 each include extensions which extend underneath a gate 44 which is atop the wafer 12. The gate 44 includes a silicide gate portion 46 and a polysilicon gate portion 48. A gate dielectric 50 is between the gate 44 and the wafer 12. The gate dielectric 50 may be formed of a conventional material such as silicon dioxide, silicon oxynitride, or silicon nitride ($Si_3N_4$). The source region 20, the drain region 22, and the body region 24 are operatively coupled with the gate 44 to form a transistor such as a MOSFET.

The semiconductor device 10 has a pair of electrically-conducting regions on opposite sides of the gate 44, such as a source-body silicide region 54 and a drain silicide region 56. The silicide regions 54 and 56 have respective exposed surfaces 58 and 60 for external electrical connection. The silicide regions 54 and 56, as shown in FIG. 2, do not extend down to the buried insulator layer 16. However, it will be appreciated that the suicide regions 54 and 56 may be extended to the buried insulator layer 16, if so desired.

The source-body suicide region 54 includes part of the source region 20 and part of the body region 24, thereby electrically coupling the source region to the body region. By contrast, the drain silicide region 56 is surrounded by the drain region 22, and therefore does not electrically couple the drain region to the body region 24. The silicide regions 54 and 56 may be substantially symmetric about the gate 44. The shallow-doped subregions 30 and 34 likewise may be substantially symmetric about the gate 44. However, the deep-doped subregions 32 and 36 are asymmetric about the gate 44, thereby allowing the source-body silicide region 54 to overlap a source-body boundary 64. It will be appreciated that the symmetry and asymmetry of the shallow-doped subregions 30 and 32, of the deep-doped subregions 32 and 36, and/or of the silicide regions 54 and 66, may alternatively be other than as shown, while still allowing the source-body silicide region to overlap a source-body boundary 64, and with the drain silicide region 56 not overlapping a drain-body boundary 66.

It will be appreciated that alternatively the electrically-conducting regions may include other materials than silicides, for example other semiconductor-metal compounds.

Atop the wafer 12, on opposite sides of the gate 44, are a gate source-side spacer 70 and a gate drain-side spacer 72. Adjacent the spacers 70 and 72, further away from the gate 44, are respective additional source-side and drain-side spacers 74 and 76. As will be described in greater detail below the spacers 70–76 may be used to mask portions of the wafer 12 during formation of the source region 20, the drain region 22, and/or the silicide regions 54 and 56. The spacers 70–76 may be made of a dielectric material, for example silicon dioxide.

Figure 3:
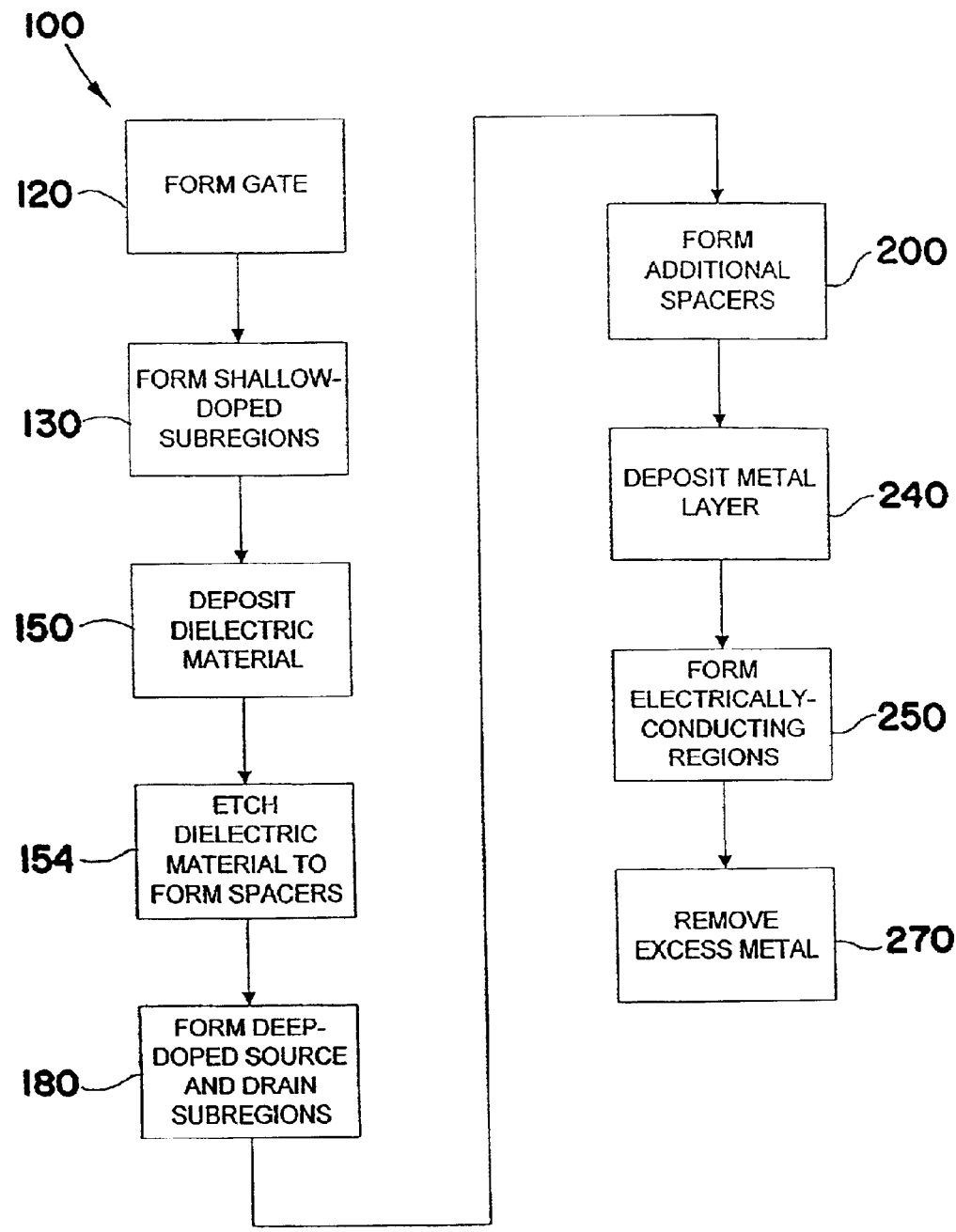
FIG. 3 is a flow chart of a method of making the first embodiment semiconductor device.

FIG. 3 is a flow chart of a method 100 for forming a semiconductor device which is similar to the semiconductor device 10 shown in FIG. 2 and described above.

Figure 4:
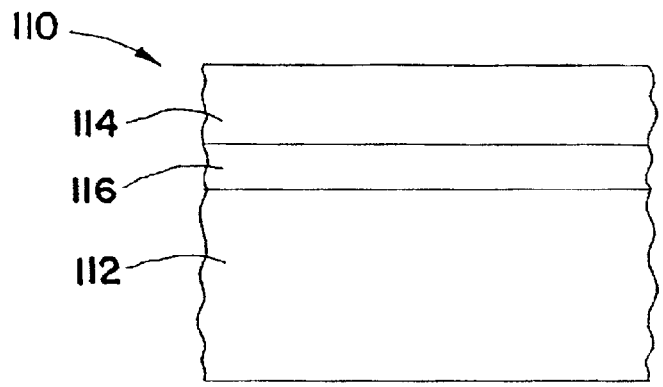
FIGS. 4–13 are side sectional views illustrating various of the steps of the method of FIG. 3.

The starting material for the method 100 is a semiconductor wafer 110 shown in FIG. 4. The semiconductor wafer 110 includes a bulk semiconductor region 112, and a surface semiconductor layer 114, with a buried insulator layer 116 therebetween. The semiconductor layer 114 may be suitably doped.

The semiconductor wafer 110 may be, for example, a silicon on insulator (SOI) wafer. Such an appropriate SOI wafer may be formed by a variety of techniques, for example SIMOX or wafer bonding techniques. It will be appreciated that suitable materials, energies, and techniques for doping the surface semiconductor layer 14 are well-known in the art. For instance, boron or indium may be implanted to achieve a P-type conductivity and phosphorus or arsenic may be implanted to form an N-type conductivity. An exemplary range of concentration of these dopant is between $1 \times 10^{20}$ and $2 \times 10^{20}$ atoms/cm$^3$.

Figure 5:
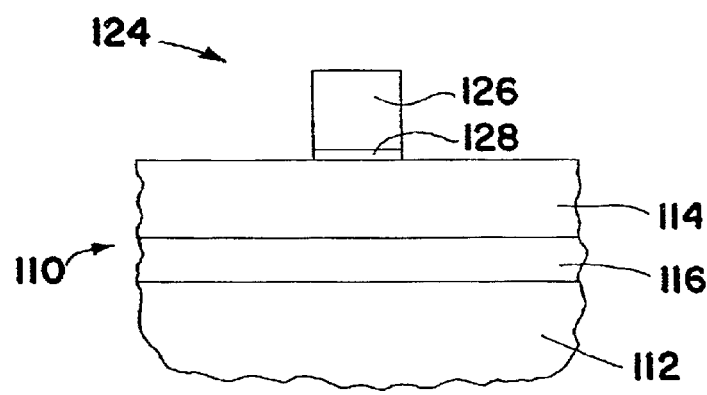

Thereafter, in step 120, illustrated in FIG. 5, a gate 126 (also referred to herein as a gate electrode) and a gate dielectric 128 is formed on the semiconductor wafer 110 as part of a semiconductor device 124. The gate electrode 126 may include suitable well-known materials, for example a semiconductor material such as polysilicon, or a suitable metal. The gate dielectric 128 may be formed of well-known materials, for example silicon dioxide.

The gate 126 and the gate dielectric 128 may be formed on the wafer 110 by suitable, well-known methods. For example, a layer of dielectric material, for example $SiO_2$ or $Si_3N_4$, may be deposited on and/or grown on the semiconductor layer 114. The layer of dielectric material may have an exemplary thickness of between about 20 to 200 Angstroms, although it will be appreciated that the layer may have a different thickness. Thereafter a layer of gate electrode material may be deposited on the dielectric material. An exemplary gate electrode material is polysilicon, which may be deposited, for example, using low pressure chemical vapor deposition (LPCVD) processing techniques, at a temperature from about 500 to 650° C., to a thickness of between about 1200 to 3000 Angstroms. The electrode material may be selectively removed, for example by well-known photolithographic and selective etching methods, to form the gate electrode 126 in a desired location. An example of a suitable etching method is reactive ion etching (RIE), using $Cl_2$ as an etchant. It will be appreciated that a wide variety of other suitable methods for gate formation may be employed in this step.

Figure 6:
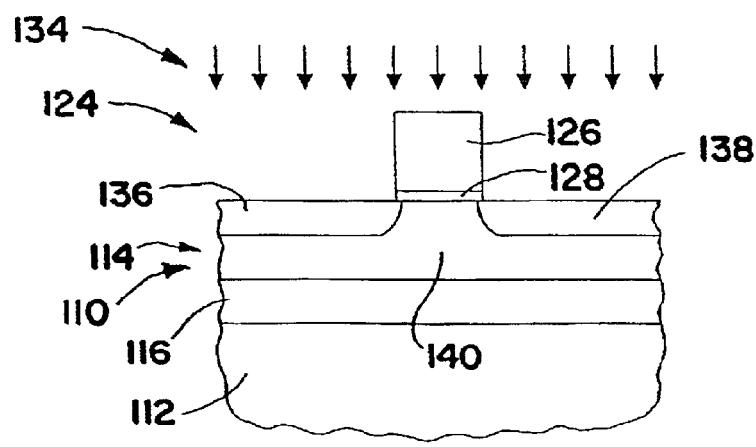

In step 130, illustrated in FIG. 6 a low-energy implantation 134 (also referred to as shallow doping) is employed to create respective shallow-doped source and drain subregions 136 and 138 in the semiconductor layer 114. Exemplary ions for the low-energy implantation 134 are $BF_2$ and arsenic, an exemplary energy range for the low-energy implantation 134 is about 5 to 80 KeV, and an exemplary range of concentrations for the low-energy implantation 134 is between $10^{12}$ and $10^{15}$ atoms/cm$^2$. The type of doping for the subregions 136 and 138 is the opposite of the conductivity type of the remainder of the semiconductor layer 114. Thus if the semiconductor layer 114 has a doping for N-type conductivity, the subregions 136 and 138 will be doped for P-type conductivity. Conversely, if the semiconductor layer 114 has P-type conductivity, the subregions 136 and 138 will have N-type conductivity.

It will be appreciated that the gate 126 acts as a mask to prevent doping in a subregion 140 of the semiconductor layer 114 which is underneath the gate and away from the edges of the gate. However, it will be appreciated that there may be some overlap between the gate 126 and the subregions 136 and 138, as is conventional. It will be appreciated that, if desired, a separate doping mask may be used in place of the gate 126 for this step, formation of the gate thereby being delayed until after such doping mask is removed.

Figure 7:
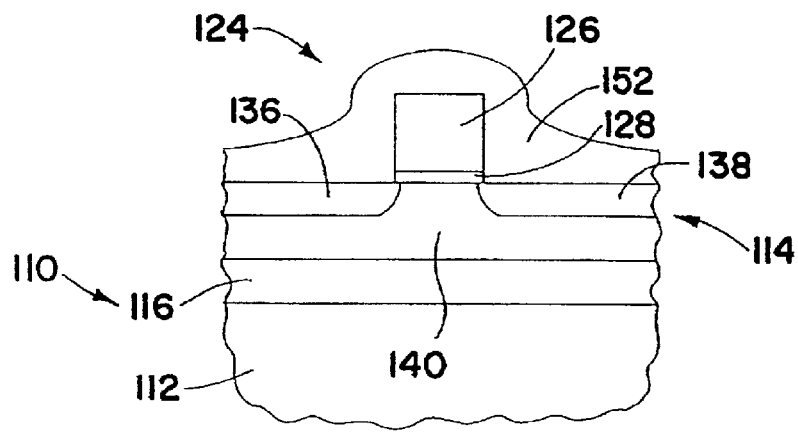
Figure 8:
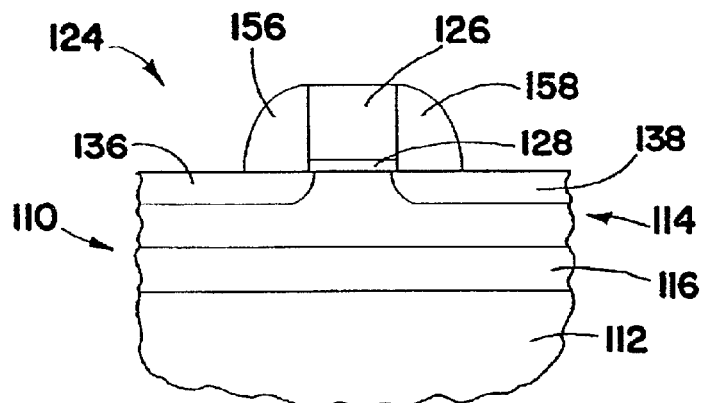

Referring now to FIGS. 7 and 8, in step 150 a conformal dielectric layer 152 is deposited on the semiconductor layer 114 and on the gate 126. In step 154 parts of the dielectric layer 152 are selectively removed to leave respective gate source-side and drain-side spacers 156 and 158. The deposit of the dielectric material and its selective removal may be accomplished by conventional means, for example chemical vapor deposition (CVD) such as LPCVD or plasma enhanced chemical vapor deposition (PECVD), of silicon dioxide, followed by anisotropic etching using suitable, well-known etchants, an exemplary etchant being $CHF_3$.

Figure 9:
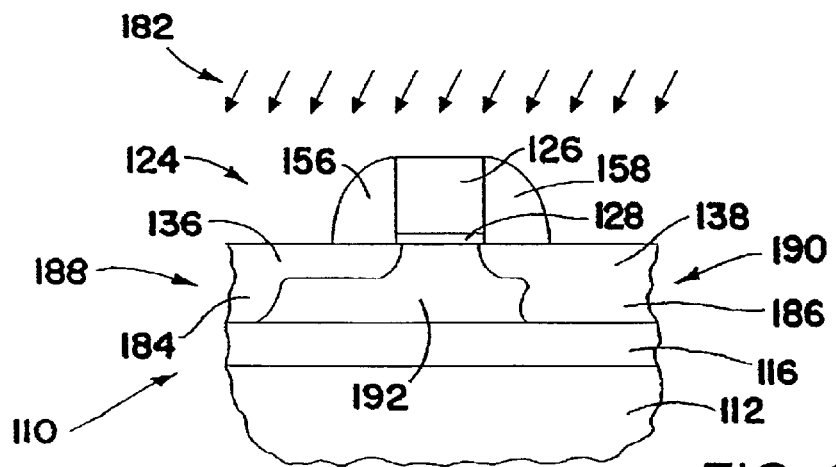

In step 180, illustrated in FIG. 9, an angled implantation 182 (also referred to as a tilted implantation) is used to form deep-doped source and drain subregions 184 and 186, respectively. A source region 188 of the layer 114 is thereby formed, the source region 188 including the source subregions 136 and 184. Similarly a drain region 190 is formed which includes the drain subregions 138 and 186. A body region 192 is defined as the region of the layer 114 between the source region 188 and the drain region 190. The gate 126 and the spacers 156 and 158 act as an implant mask, blocking implantation in the part of the semiconductor layer 114 which is beneath the gate 126. The tilted or angled implantation 182 is made at an angle α to the direction perpendicular to the semiconductor layer 114. Exemplary ions for the angled implantation 182 are those given above, an exemplary energy range for the angled implantation 182 is about 5 to 80 KeV, and an exemplary range of concentrations for the angled implantation 182 is between $2 \times 10^{15}$ and $4 \times 10^{15}$ atoms/cm$^2$. The tilt angle α may be in the range of 30 to 70°, and may be in the range of 45 to 60°. Due to the angled nature of the implantation 182, the deep-doped subregions 184 and 186 are asymmetric about the gate 126. It will be appreciated that the deep-doped subregions 184 and 186 may be in contact with the buried insulator layer 116. Alternatively, it will be appreciated that the deep-doped subregions 184 and 186 need not be in contact with the buried insulator layer 116, if so desired.

Figure 10:
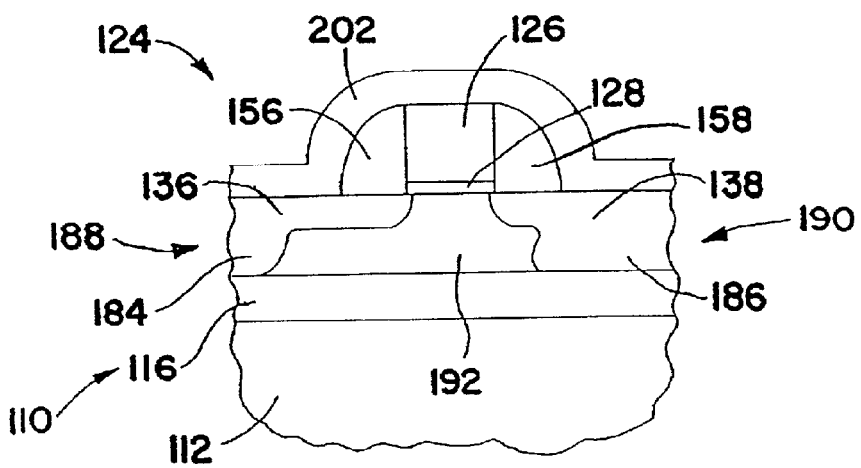
Figure 11:
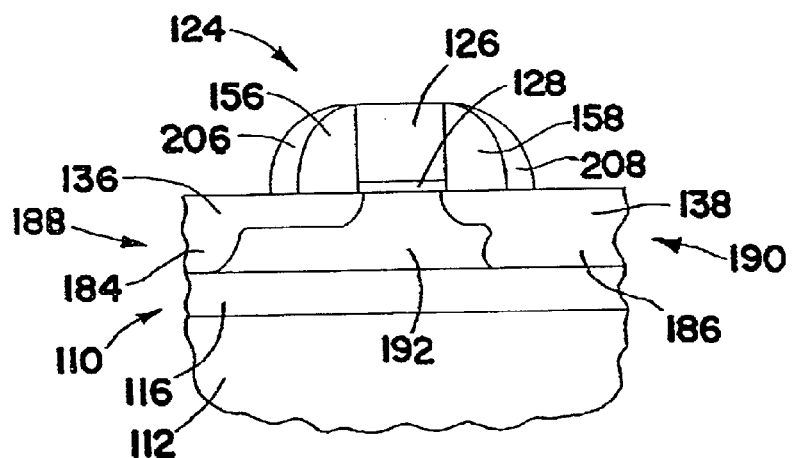

In step 200, illustrated in FIGS. 10 and 11, additional spacers are formed on opposite sides of the gate. Referring to FIG. 10, a dielectric layer 202 is deposited atop the semiconductor layer 114, the gate 126, and the spacers 156 and 158. Then, as illustrated in FIG. 11, portions of the dielectric layer 202 are selectively removed to leave respective additional source-side and drain-side spacers 206 and 208. The formation of the additional spacers 206 and 208 may be similar to the formation of the spacers 156 and 158 described above.

Figure 12:
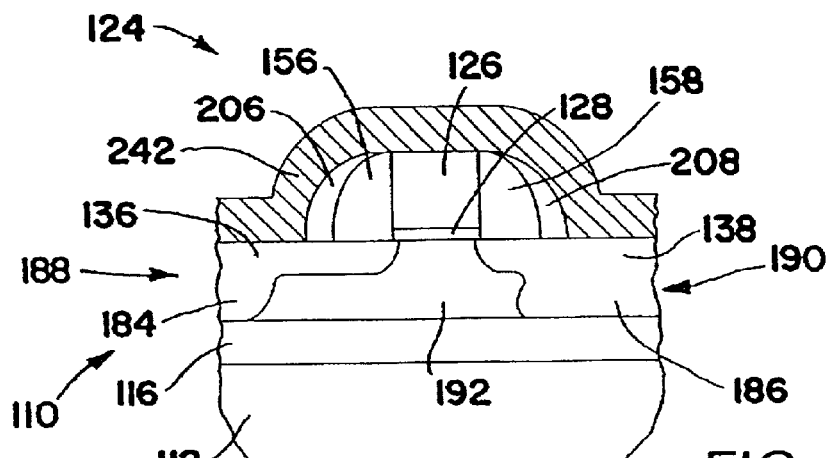

Thereafter, as illustrated in FIG. 12, in step 240 a layer of metal 242 is deposited upon the gate 126, the spacers 156 and 158, the additional spacers 206 and 208, and the exposed portions of the semiconductor layer 114. The metal of the metal layer 242 may be a metal such as titanium, cobalt, or nickel, which is suitable for forming a conducting compound, such as a silicide, with the semiconductor material. The metal layer 242 may be deposited, for example, by sputtering.

Figure 13:
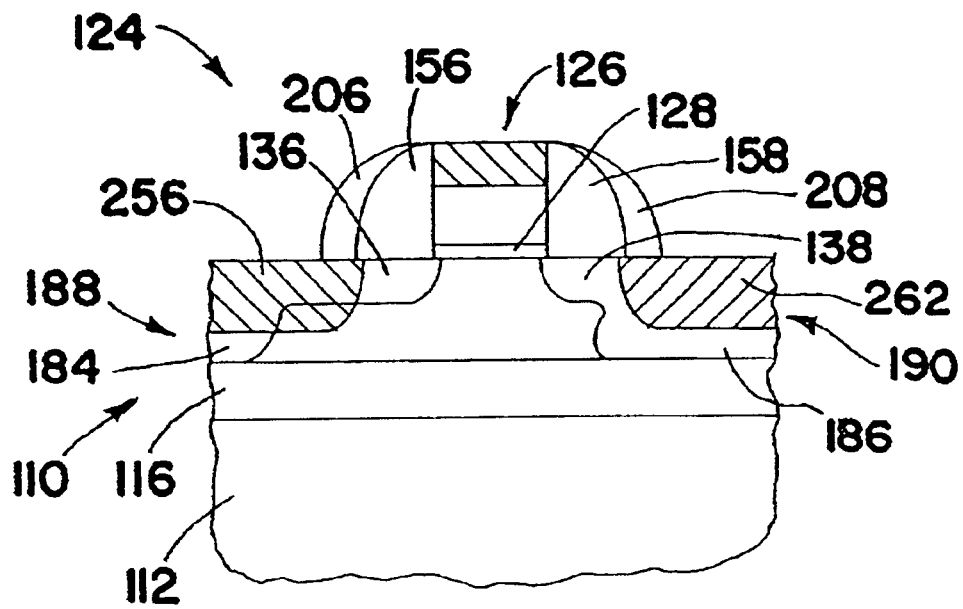

Referring now to FIG. 13, in step 250 a compound such as a silicide is formed between the metal of the metal layer 242 and the exposed portions of the semiconductor layer 114 and the gate electrode 126. Suitable methods for formation of such electrically-conducting compounds (e.g., silicidation) are well known, an exemplary method being raising temperature of the semiconductor device 124 to a suitable level for a suitable length of time (annealing). An exemplary temperature is between about 500 and 700° C., and an exemplary suitable length of time is between 10 seconds and 10 minutes. Rapid thermal annealing (RTA) may also be employed, for example subjecting the semiconductor device 124 to a temperature between 600 and 900° C. for about 5 to 120 seconds. It will be appreciated that other temperatures and heating times may be employed.

The conditions for formation of the electrically-conducting compounds, in conjunction with the angled implantation and the formation of the additional spacers, are selected such that a source-body electrically-conducting region 256 is formed which electrically connects the source region 188 to the body region 192. For example, it will be appreciated that the parameters for the compound formation (for example the temperature and heating time) may be selected to allow achievement of the desired penetration of the compounds. Due to the asymmetry of the deep-doped source and drain subregions 184 and 186 about the gate 126, an electrically-conducting drain region 262 is formed wholly within the drain region 190 of the semiconductor layer 114, the electrically-conducting drain region 262 not electrically coupling the drain region to the body region 192.

In step 270 excess metal of the metal layer 242 is removed by conventional, well-known means, thereby leaving the semiconductor device 124 shown in FIG. 13.

Figure 14:
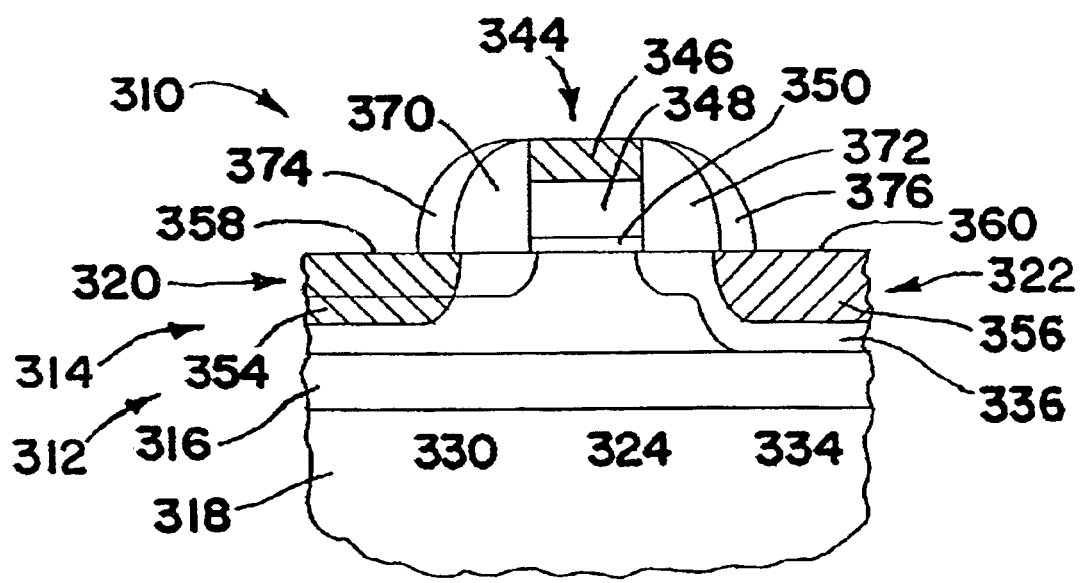
FIG. 14 is a side sectional view of a second embodiment semiconductor device in accordance with the present invention.

Referring now to FIG. 14, a semiconductor device 310 is shown which has a novel SOI body-source electrical contact made using asymmetry in formation of the source and drain regions due to formation of a deep-doped drain subregion, but not a corresponding deep-doped source subregion. The semiconductor device 310 includes a wafer 312, the wafer including a semiconductor layer 314, a buried insulator layer 316, and a bulk semiconductor region 318. An exemplary wafer 312 is a silicon-on-insulator (SOI) wafer with silicon in the semiconductor layer 314 and the bulk semiconductor region 318, and silicon dioxide ($SiO_2$) in the buried insulator layer 316.

The semiconductor layer 314 is divided into a source region 320, a drain region 322, and a body region 324 which is between the source region and the drain region. The source region 320 and the drain region 322 have opposite conductivity from the body region 324.

The source region 320 includes a shallow-doped source subregion 330. In contrast, the drain region 322 includes both a shallow-doped subregion 334 and a deep-doped drain subregion 336. The shallow-doped subregions 330 and 334 each include extensions which extend underneath a gate 344 which is atop the wafer 312. The gate 344 includes a silicide gate portion 346 and a polysilicon gate portion 348. A gate dielectric 350 is between the gate 344 and the wafer 312. The gate dielectric 350 may be formed of a conventional material such as silicon dioxide, silicon oxynitride, or silicon nitride ($Si_3N_4$). The source region 320, the drain region 322, and the body region 324 are operatively coupled with the gate 344 to form transistor such as a MOSFET.

The semiconductor device 310 has a pair of electrically-conducting regions on opposite sides of the gate 344, such as a source-body silicide region 354 and a drain silicide region 356. The suicide regions 354 and 356 have respective exposed surfaces 358 and 360 for external electrical connection.

The source-body silicide region 354 includes part of the source region 320 and part of the body region 324, thereby electrically coupling the source region to the body region. By contrast, the drain silicide region 356 is surrounded by the drain region 322, and therefore does not electrically couple the drain region to the body region 324. The silicide regions 354 and 356 may be substantially symmetric about the gate 344. The shallow-doped subregions 330 and 334 likewise may be substantially symmetric about the gate 344.

However, the presence of a deep-doped drain subregion 336 and the lack of a corresponding deep-doped source subregion leads to an asymmetry about the gate 344 between the source region 320 and the drain region 322, thereby allowing the source-body silicide region 354 to overlap a source-body boundary 364. It will be appreciated that the asymmetry between the source and drain regions 320 and 322 alternatively may be other than as shown, while still allowing the source-body silicide region 354 to overlap a source-body boundary 364, and with the drain silicide region 356 not overlapping a drain-body boundary 366. Atop the wafer 312, on opposite sides of the gate 344, are a gate source-side spacer 370 and a gate drain-side spacer 372. Adjacent the spacers 370 and 372, further away from the gate 344, are respective additional source-side and drain-side spacers 374 and 376.

Figure 15:
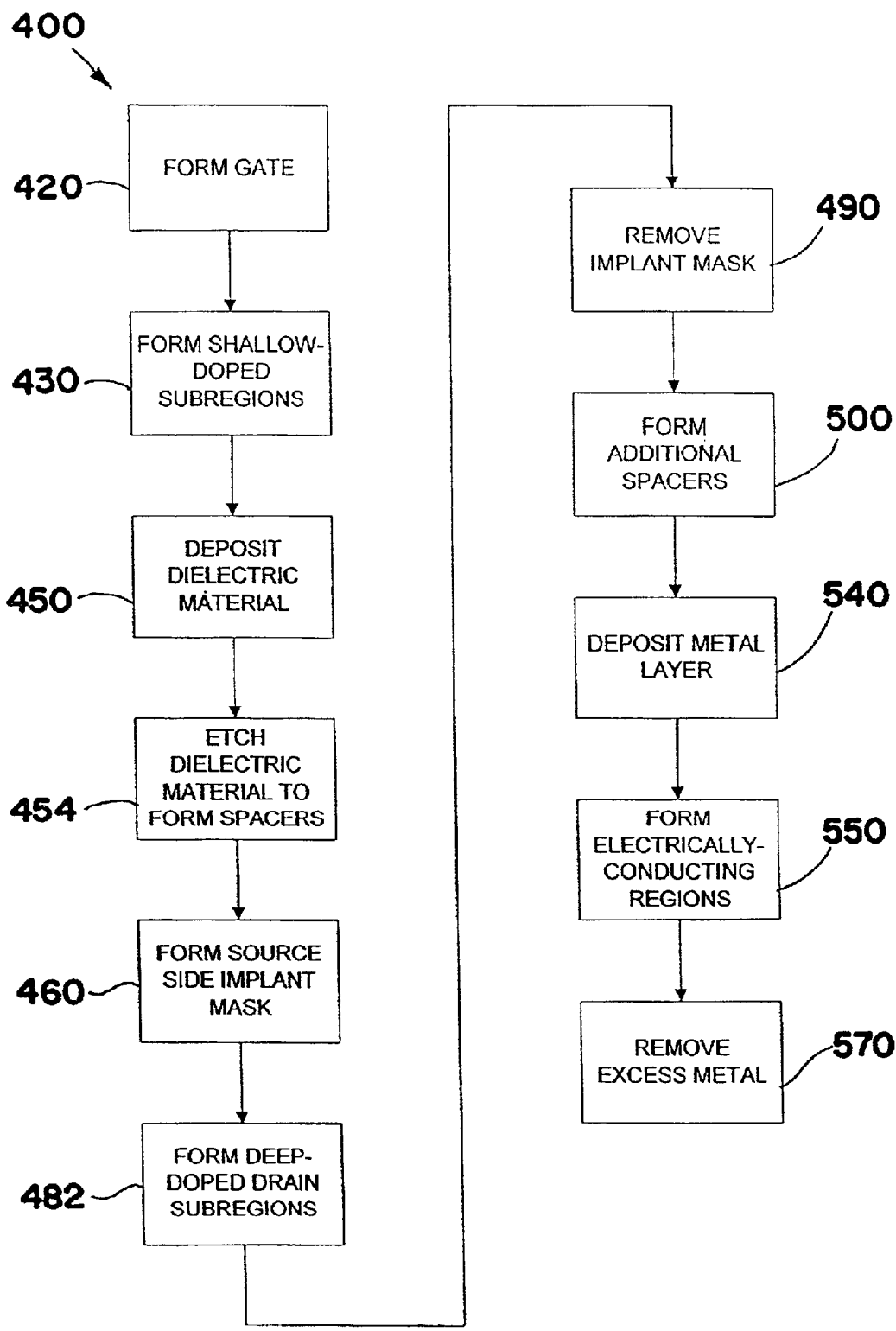
FIG. 15 is a flow chart of a method of making the second embodiment semiconductor device.

FIG. 15 is a flow chart of a method 400 for forming a semiconductor device which is similar to the semiconductor device 310 shown in FIG. 14 and described above.

Figure 16:
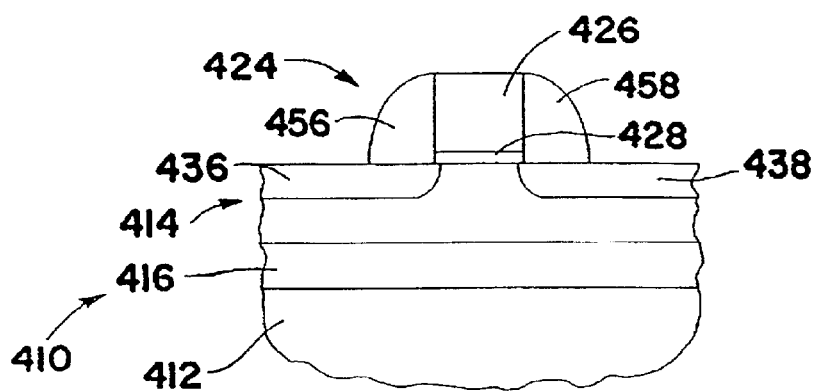
FIGS. 16–20 are side sectional views illustrating various of the steps of the method of FIG. 15.

The steps 420, 430, 450, and 454 of the method 400 may be similar to the corresponding steps of the method 100 described above. The resulting semiconductor device 424 formed by these steps is shown in FIG. 16. The semiconductor device 424 has parts and/or features corresponding to those of the semiconductor device 124 described above: a semiconductor wafer 410 which includes a bulk semiconductor region 412 and a surface semiconductor layer 414, with a buried insulator layer 416 therebetween; a gate 426 and a gate dielectric 428; shallow-doped source and drain subregions 436 and 438, respectively; a subregion 440 underneath the gate 426; and respective gate sourceside and drain-side spacers 456 and 458.

Figure 17:
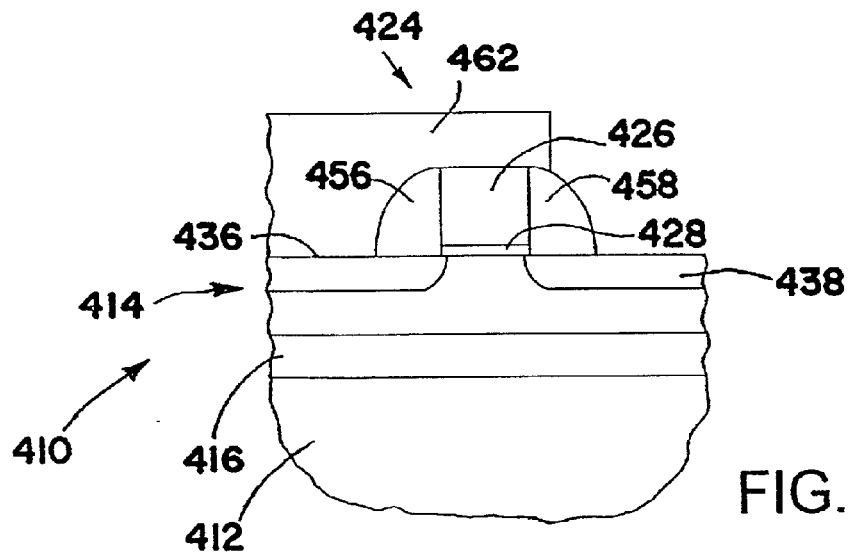

In step 460, illustrated in FIG. 17, an implant mask 462 is formed on the source side of the semiconductor device 424. The implant mask 462 may be formed using suitable, well-known lithography techniques, for example by depositing a layer of resist, by selectively exposing the resist by use of an exposure mask and a radiation source such as a light source, and by removing the exposed or unexposed resist, as desired.

Figure 18:
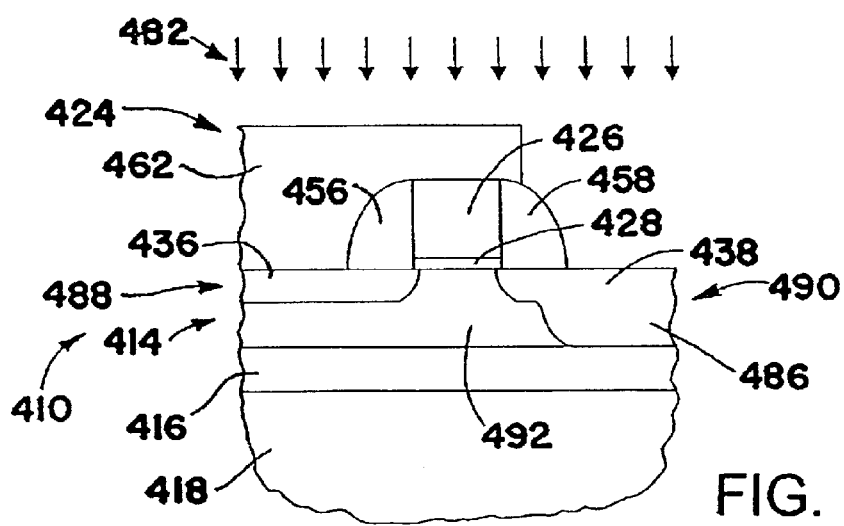

In step 480, illustrated in FIG. 18, an implantation 482 is used to form a dee-doped drain subregions 486. The implant mask 462 prevents formation of a corresponding deep-doped source subregion, and therefore a source region 488 of the layer 414 includes only the shallow-doped source subregion 436. By contrast, a drain region 490 is formed which includes both the drain subregions 438 and 486. The source region 488 and the drain region 490 are therefore asymmetric about the gate 426. A body region 492 is defined as the region of the layer 414 between the source region 488 and the drain region 490. The gate 426, the spacers 456 and 458, and the implant mask 462 blocking implant in the part of the semiconductor layer 414 which is beneath the gate 426. The implantation 482 may be a perpendicular implantation, or may alternatively be a tilted or angled implantation. Suitable exemplary ions, energies, and concentrations for the implantation 482 are those given above with regard to the angled implantation 182. The deep-doped drain subregion 486 may either be in contact with or not be in contact with the buried insulator layer 416.

Figure 19:
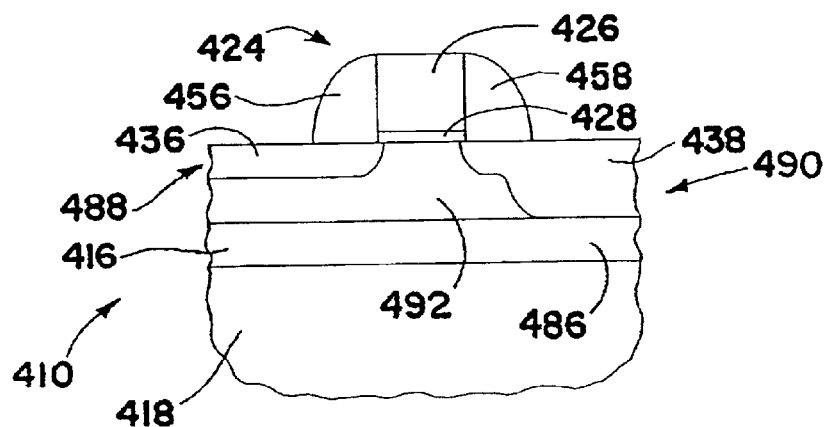

In step 490, illustrated in FIG. 19, the implant mask 462 is removed, for example by use of a suitable solvent.

Figure 20:
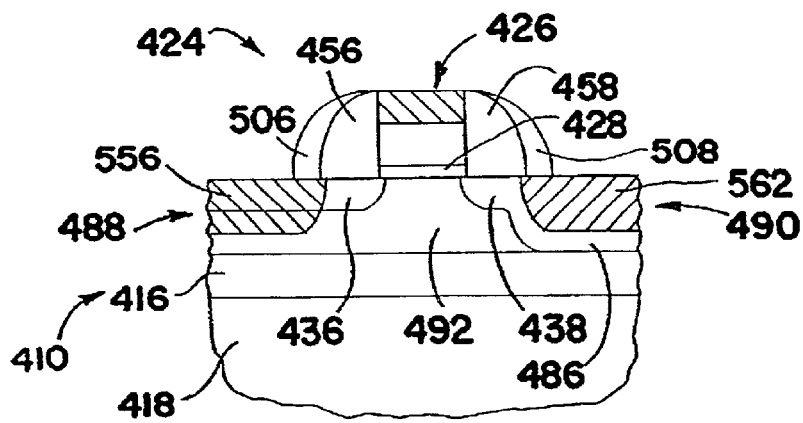

The steps 500, 540, 550, and 570 may be similar to the corresponding steps of the method 100 described above. Thus, as shown in FIG. 20, parts and/or features of the semiconductor device 424 may be formed which are comparable to those of the semiconductor device 124 described above: additional source-side and drain-side spacers 506 and 508; a source-body electrically-conducting region 556 which electrically connects the source region 488 to the body region 492; and an electrically-conducting drain region 562 formed wholly within the drain region 490 of the semiconductor layer 414.

Figure 21:
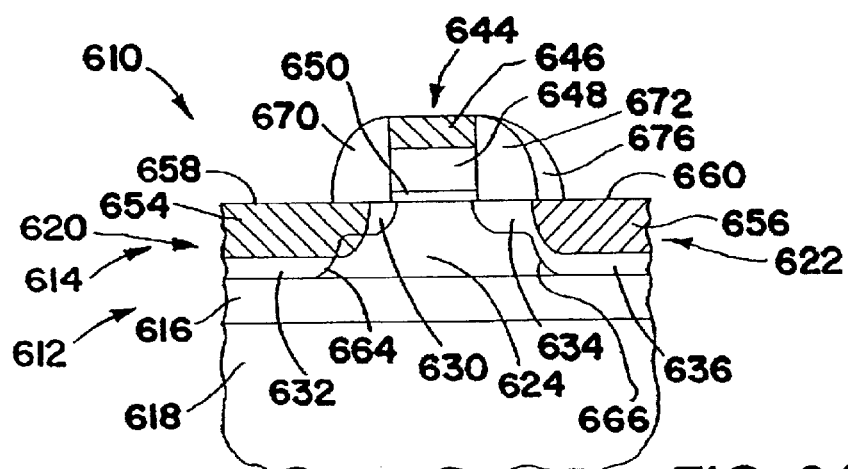
FIG. 21 is a side sectional view of a third embodiment semiconductor device in accordance with the present invention.

Referring now to FIG. 21, a semiconductor device 610 is shown which has a novel SOI body-source electrical contact made using electrically-conducting regions which are asymmetric with one another about a gate, due to formation of an additional spacer on the drain side, but not on the source side. The semiconductor device 610 includes a wafer 612, the wafer including a semiconductor layer 614, a buried insulator layer 616, and a bulk semiconductor region 618. An exemplary wafer 612 is a silicon-on-insulator (SOI) wafer with silicon in the semiconductor layer 614 and the bulk semiconductor region 618, and silicon dioxide ($SiO_2$) in the buried insulator layer 616.

The semiconductor layer 614 is divided into a source region 620, a drain region 622, and a body region 624 which is between the source region and the drain region. The source region 620 and the drain region 622 have opposite conductivity from the body region 624.

The source region 620 includes a shallow-doped source subregion 630 and a deep-doped source subregion 632. Similarly, the drain region 622 includes a shallow-doped subregion 634 and a deep-doped drain subregion 636. The shallow-doped subregions 630 and 634 each include an extension which extends underneath a gate 644 which is atop the wafer 612. The gate 644 includes a silicide gate portion 646 and a polysilicon gate portion 648. A gate dielectric 650 is between the gate 644 and the wafer 612. The gate dielectric 650 may be formed of a conventional material such as silicon dioxide, silicon oxynitride, or silicon nitride ($Si_3N_4$). The source region 620, the drain region 622, and the body region 624 are operatively coupled with the gate 644 to form transistor such as a MOSFET. The source and drain regions 620 and 622 may be substantially symmetric with one another about the gate 644.

The semiconductor device 610 has a pair of electrically-conducting regions on opposite sides of the gate 644, such as a source-body silicide region 654 and a drain silicide region 656. The silicide regions 654 and 656 have respective exposed surfaces 658 and 660 for external electrical connection.

The source-body silicide region 654 includes part of the source region 620 and part of the body region 624, thereby electrically coupling the source region to the body region. By contrast, the drain silicide region 656 is surrounded by the drain region 622, and therefore does not electrically couple the drain region to the body region 624. As noted above, the source region 620 may be substantially symmetric to the drain region 622 about the gate 644. However, the silicide regions 654 and 656 are asymmetric about the gate 644 so as to achieve the above-described electrical coupling of the source region 620 and the body region 624, while avoiding electrical coupling of the drain region 622 and the body region 624, allowing the source-body silicide region 654 to overlap a source-body boundary 664. It will be appreciated that the asymmetry between the silicide regions 654 and 656 alternatively may be other than as shown, while still allowing the source-body silicide region 654 to overlap a source-body boundary 664, and with the drain silicide region 656 not overlapping a drain-body boundary 666. In addition, it will be appreciated that alternatively the source region 620 may be other than substantially symmetric with the drain region 622 about the gate 644, if desired.

Atop the wafer 612, on opposite sides of the gate 644, are a gate source-side spacer 670 and a gate drain-side spacer 672. Adjacent the drain-side spacer 672, further away from the gate 644, is an additional drain-side spacer 676. As described in greater detail below, the asymmetry of having an additional drain-side spacer 676 without a corresponding additional source-size spacer is used to create the aforementioned asymmetry of the silicide regions 654 and 656 with one another about the gate 644.

Figure 22:
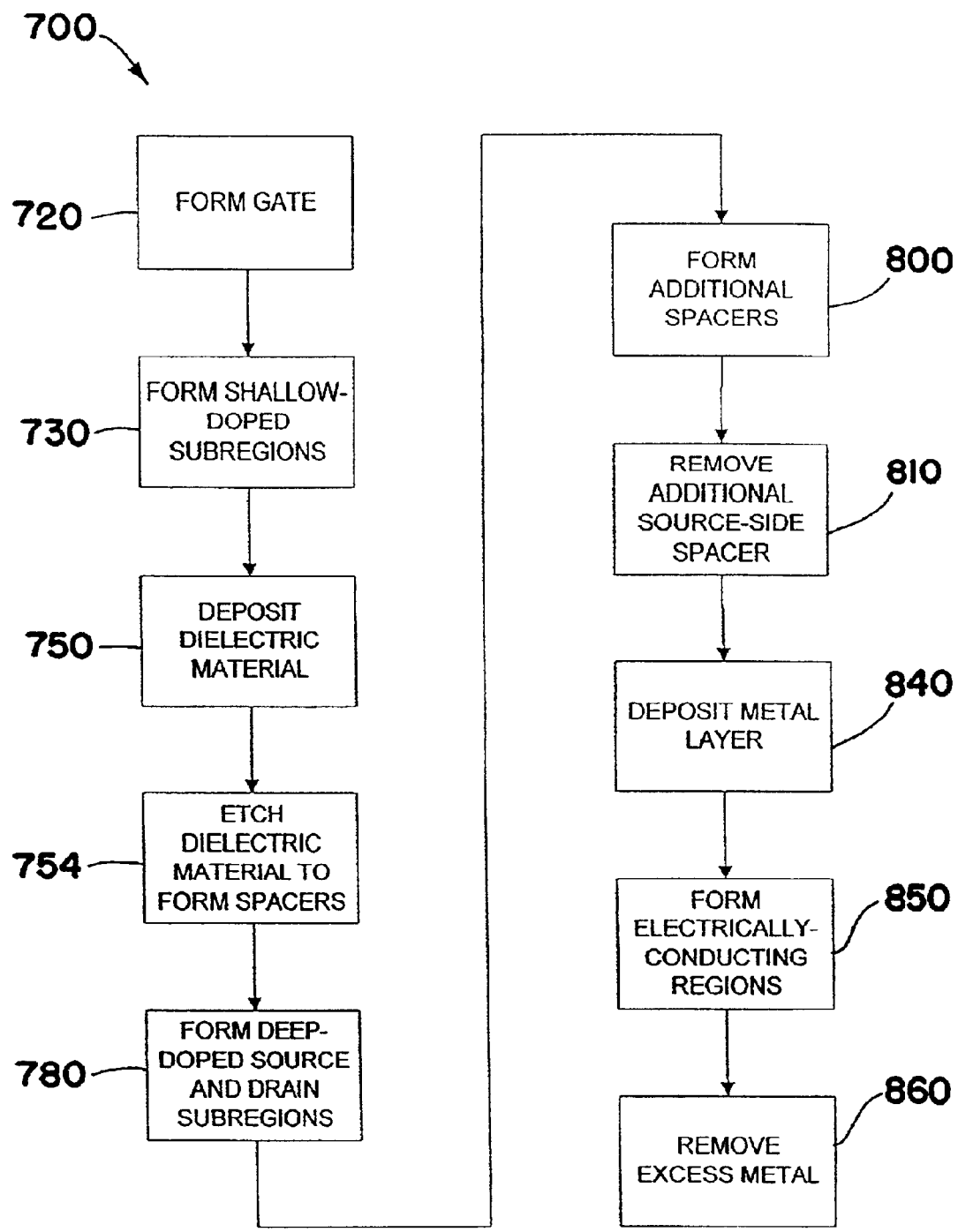
FIG. 22 is a flow chart of a method of making the third embodiment semiconductor device.

FIG. 22 is a flow chart of a method 700 for forming a semiconductor device which is similar to the semiconductor device 610 shown in FIG. 21 and described above.

Figure 23:
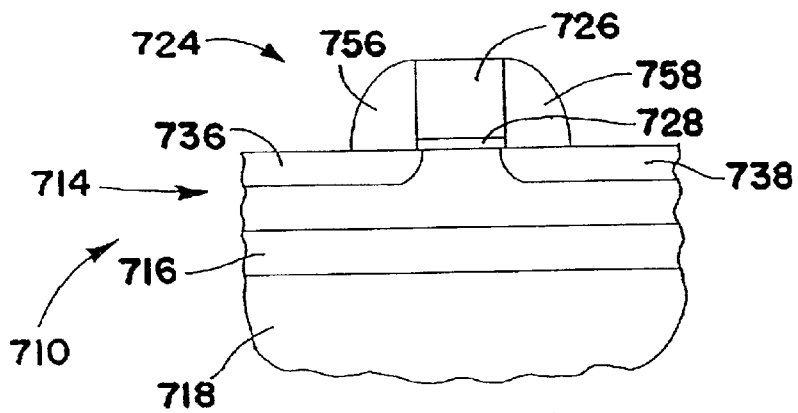
FIGS. 23–27 are side sectional views illustrating various of the steps of the method of FIG. 22.

The steps 720, 730, 750, and 754 of the method 700 may be similar to the corresponding steps of the methods 100 and 400 described above. The resulting semiconductor device 724 formed by these steps is shown in FIG. 23. The semiconductor device 724 has parts and/or features corresponding to those of the semiconductor devices 124 and 424 described above: a semiconductor wafer 710 which includes a bulk semiconductor region 712 and a surface semiconductor layer 714, with a buried insulator layer 716 therebetween; a gate 726 and a gate dielectric 728; shallow-doped source and drain subregions 736 and 738, respectively; a subregion 740 underneath the gate 726; and respective gate source-side and drain-side spacers 756 and 758.

Figure 24:
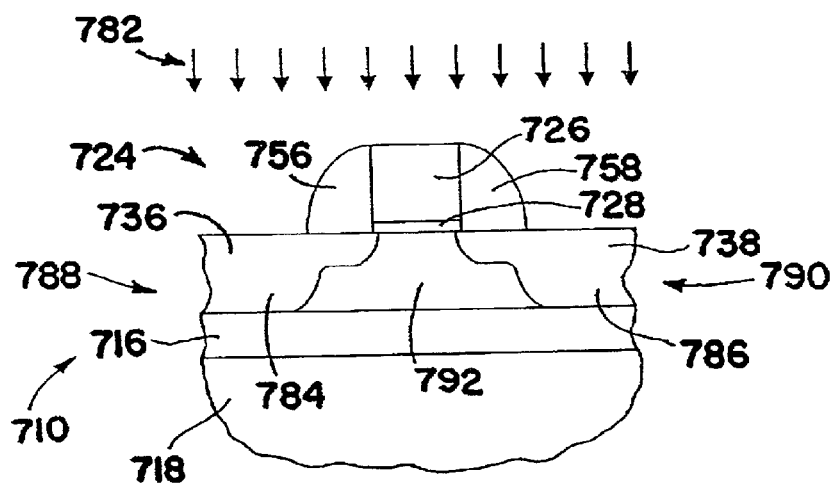

In step 780, illustrated in FIG. 24, an implantation 782 is used to form deep-doped source and drain subregions 784 and 786, respectively. A source region 788 of the layer 714 is thereby formed, the source region 788 including the source subregions 736 and 784. Similarly a drain region 790 is formed which includes the drain subregions 738 and 786. A body region 792 is defined as the region of the layer 714 between the source region 788 and the drain region 790. The gate 726 and the spacers 756 and 758 act as an implant mask, blocking implantation in the part of the semiconductor layer 714 which is beneath the gate 726. The implantation 782 may be a perpendicular implantation, or may alternatively be a tilted or angled implantation. Suitable exemplary ions, energies, and concentrations for the implantation 782 are those given above with regard to the angled implantation 182. The deepdoped subregions 784 and 786 may either be in contact with or not be in contact with the buried insulator layer 716.

Figure 25:
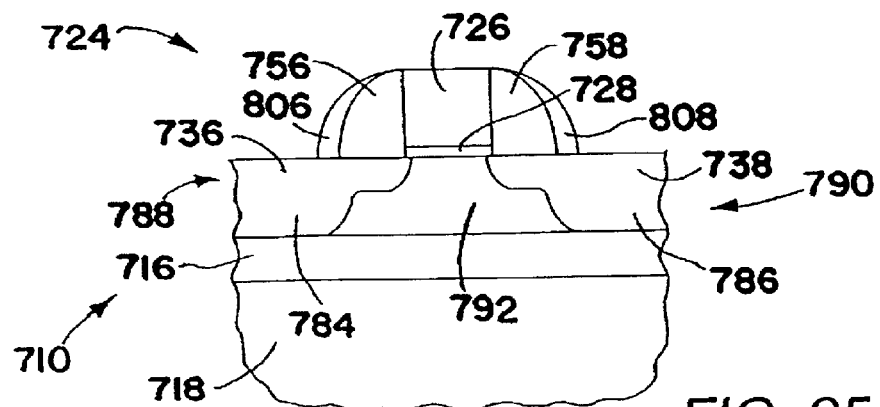

In step 800, illustrated in FIG. 25, additional source-side and drain-side spacers 806 and 808, respectively, are formed further from the gate 726 than the respective gate source-side and drain-side spacers 756 and 758. The step 800 may be similar to the corresponding steps in the methods 100 and 400 described above.

Figure 26:
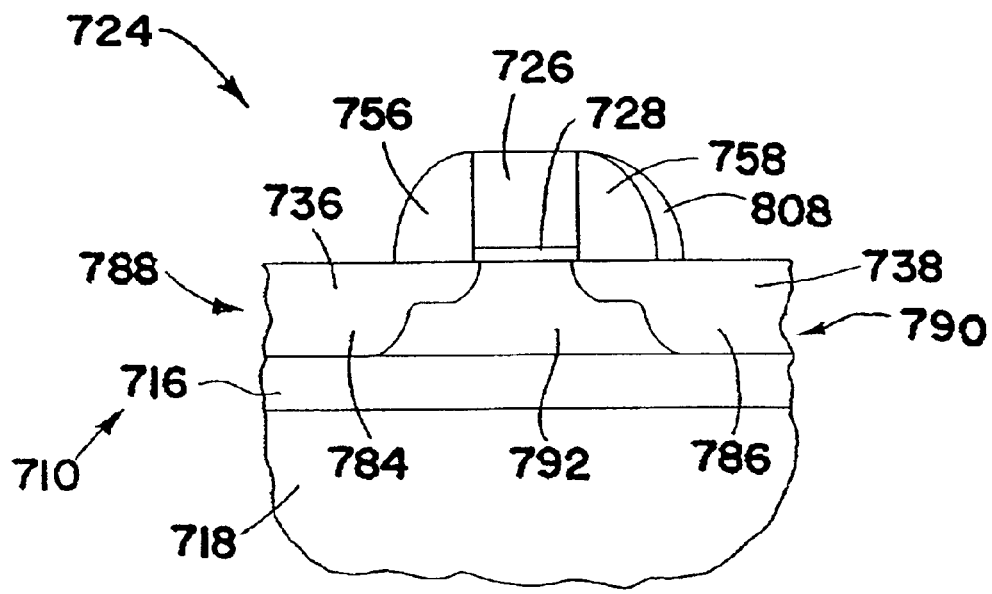

Thereafter, in step 810, the additional source-side spacer 806 is removed. The source-side spacer 806 may be removed by a masking and etching process, as illustrated in FIG. 26. First, an etch mask 814 is formed to protect the drain-side spacer 808 from etching. The etch mask 814 may be formed using suitable, well-known lithography techniques, for example by depositing a layer of resist, by selectively exposing the resist by use of an exposure mask and a radiation source such as a light source, and by removing the exposed or unexposed resist, as desired. Thereafter an etchant is used to selectively remove the source-side spacer 806. Exemplary etchants are those described elsewhere in this description. Finally, the etch mask 814 is removed using suitable solvents and/or techniques.

It will be appreciated that the removal process in step 810 alternatively may remove a portion or portions of the source-side spacer 756, and/or may leave unremoved a portion or portions of the additional source-size spacer 806. It will further be appreciated that the formation of the semiconductor device 724 with an additional drain-side spacer 758, but without an additional source-side spacer, may be accomplished in a variety of alternative ways. For example, masking processes may be employed to prevent formation of an additional source-side spacer entirely.

Figure 27:
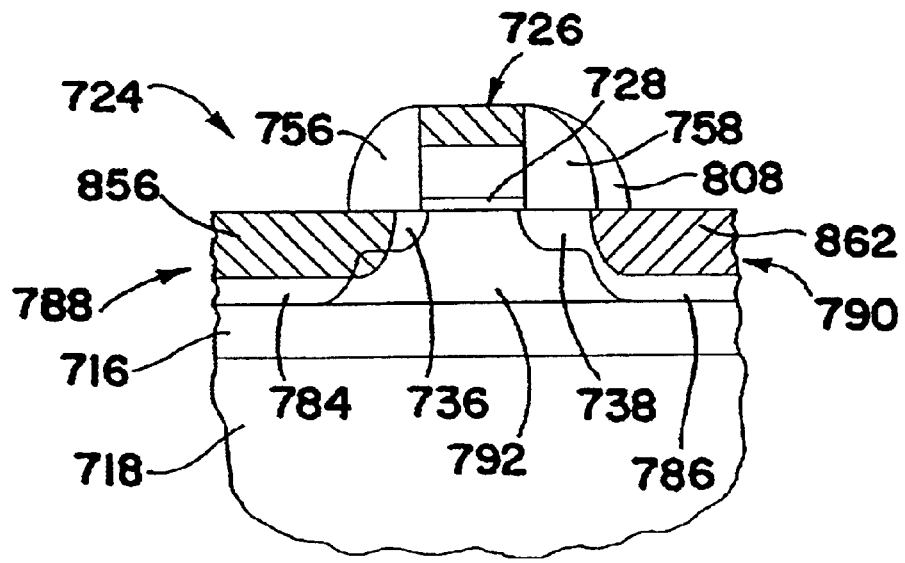

The steps 840, 850, and 870 may be similar to the corresponding steps of the methods 100 and 400 described above. As shown in FIG. 27, thus parts and/or features of the semiconductor device 724 may be formed which bear some similarity to those of the semiconductor devices 124 and 424 described above: a source-body electrically-conducting region 856 which electrically connects the source region 788 to the body region 792; and an electrically-conducting drain region 862 formed wholly within the drain region 790 of the semiconductor layer 714. It will of course be appreciated that the electrically-conducting regions 856 and 862 are asymmetric with one another about the gate 726, in contrast to the electrically-conducting regions of the devices 124 and 424, which are symmetric with one another about their respective gates.

Although the invention has been shown and described with respect to a certain embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. A method of forming a semiconductor device comprising:

forming source, drain, and body regions in a semiconductor layer, forming a gate on the semiconductor layer, forming a semiconductor-metal compound region including part of the source region and part of the body region the semiconductor-metal compound region electrically coupling the source region and the body region, forming another semiconductor-metal compound region including part of the drain region, and prior to the forming the semiconductor-metal compound regions, forming an additional spacer on a drain side of the gate wherein the forming the source, drain, and body regions includes shallow implanting and deep implanting to form the source region and the drain region, wherein the deep implanting is asymmetric about the gate, wherein the semiconductor-metal compound regions are substantially symmetric about the gate, wherein the gate is operatively coupled with the source, drain, and body regions, wherein the forming an additional spacer includes depositing a conformal layer of dielectric material on the semiconductor layer and the gate, anisotropically etching the conformal layer to leave a pair of spacers, one on each side of the gate, and removing one of the spacers to leave the additional spacer on the drain side.

2. The method of claim 1, wherein the deep implanting includes angled implanting.

3. The method of claim 1, wherein the shallow implanting is substantially symmetric about the gate.

4. The method of claim 1, wherein the forming the semiconductor-metal compound region includes forming the semiconductor-metal compound region such that it has an exposed surface.

5. The method of claim 1, wherein the semiconductor device includes a buried insulator layer, and the forming the semiconductor-metal compound region includes forming the semiconductor-metal compound region such that the semiconductor-metal compound region is not in contact with the insulator layer.

6. The method of claim 1, wherein the forming the semiconductor-metal compound region includes forming a silicide region.

7. The method of claim 6, wherein the forming a silicide region includes depositing metal on the source region and thermally annealing the semiconductor device.

* * * * *

UNITED STATES PATENT AND TRADEMARK OFFICE
CERTIFICATE OF CORRECTION

PATENT NO. : 6,790,750 B1
DATED : September 14, 2004
INVENTOR(S) : Long et al.

It is certified that error appears in the above-identified patent and that said Letters Patent is hereby corrected as shown below:

Column 1,
Line 52, replace "utlizes" with -- utilizes --

Column 2,
Line 13, replace "suicide" with -- silicide --

Column 5,
Lines 23 and 25, replace "suicide" with -- silicide --
Line 39, replace "54 and 66" with -- 54 and 56 --

Column 8,
Line 56, replace "suicide" with -- silicide --

Column 9,
Line 40, replace "dee-doped" with -- deep-doped --

Column 11,
Line 33, replace "deepdoped" with -- deep-doped --

Signed and Sealed this

Seventh Day of December, 2004

JON W. DUDAS
*Director of the United States Patent and Trademark Office*